United States Patent [19]

Widener

[11] Patent Number: 4,777,388

[45] Date of Patent: Oct. 11, 1988

[54] FAST LATCHING FLIP-FLOP

[75] Inventor: Glenn F. Widener, Hillsboro, Oreg.

[73] Assignee: Tektronix, Inc., Beaverton, Oreg.

[21] Appl. No.: 134,582

[22] Filed: Dec. 14, 1987

Related U.S. Application Data

[63] Continuation of Ser. No. 855,261, Apr. 24, 1986, abandoned.

[51] Int. Cl.[4] .................. H03K 3/204; H03K 17/16
[52] U.S. Cl. .................. 307/272.2; 307/442; 307/443
[58] Field of Search ............ 307/442, 443, 269, 480, 307/272 A, 481, 272 R; 328/206, 34; 371/61, 47, 57, 62; 375/106, 108

[56] References Cited

U.S. PATENT DOCUMENTS 3,358,238 12/1967 Shapiro et al. .................. 328/196
4,303,838 12/1981 Lambert .................. 307/272 A
4,532,440 7/1985 Barre .................. 307/455
4,591,737 5/1986 Campbell .................. 307/272 A Primary Examiner—Stanley D. Miller
Assistant Examiner—Richard Roseen
Attorney, Agent, or Firm—Francis I. Gray; Boulden G. Griffith

[57] ABSTRACT

A fast latching flip-flop has a transparent latch master section with an input amplifier, an output latch, a current source connected to provide current for the input amplifier and the output latch, and a switch for applying the current from the current source to either the input amplifier or the output latch. A slave section is connected to the output latch to transfer the data from the output latch to the output of the fast latching flip-flop. A delay transistor is inserted between the switch and the input amplifier to add delay in the turn-off of the input amplifier. Additional delay is attained by connecting a plurality of diode-connected transistors to the junction of the delay transistor and the switch. The result is a reduction of the metastable region between the turn-off of the input amplifier and the turn-on of the output latch.

7 Claims, 2 Drawing Sheets

FAST LATCHING FLIP-FLOP

This is a continuation of application Ser. No. 855,261, filed Apr. 24, 1986, and now abandoned.

BACKGROUND OF THE INVENTION

The present invention relates to flip-flops, and more particularly to a fast latching flip-flop for higher frequency clocking and faster data latching with a shortened metastable region.

In digital systems where input signals come from different sources with no common time reference, signals may occur which are not logically defined. The interactions between these systems are asynchronous. An example is a test instrument, such as a logic analyzer, which has an internal clock to provide internal synchronization but which samples signals from devices under test having an unrelated clock. This means that data samples taken by the test instrument are random in time with respect to the internal clock, and an input signal may change during a sample clock edge of the internal clock. To prevent system failure a synchronizer, such as a flip-flop, is used at the input to the test instrument to provide reliable communication between asynchronous systems.

In an ECL master-slave D-type flip-flop there is a transparent data input amplifier followed by a latch. In operation the data is input to the input amplifier and transferred to the latch at the leading edge of a clock pulse. The clock pulse turns off the input amplifier and turns on the latch. Due to the parasitic capacitances of the components there is a period of time during which the input amplifier is off before the latch is on. During this period new data at the input will not be transferred to the latch, or will cause the latch to make an erroneous or random decision. This period commonly is referred to as the metastable region. A typical flip-flop of this type has a metastable region on the order of 600 picoseconds. However, where an acquisition accuracy for the data of 0.5 nanoseconds is desired, a metastable region of much shorter duration is desired.

SUMMARY OF THE INVENTION

Accordingly the present invention provides a fast latching ECL flip-flop having a significantly reduced metastable region. An entirely differential master-slave flip-flop has the master and slave sections operating on opposite phases of a differential clock. The master section has a differential data input amplifier with an associated current source enabled during one phase of the differential clock and a latch with an associated current source enabled during the other phase of the differential clock. Inserted between the data input amplifier and its associated current source is a common base transistor which introduces a delay between the time the differential clock turns off the current source and the time the current stops flowing in the data input amplifier. Also at the junction of the delay transistor and the current source is inserted a plurality of diode-connected transistors to add additional capacitance which increases the delay for the turn-off of the data input amplifier. Thus, by decreasing the time between turn-off of the data input amplifier and the turn-on of the latch, the metastable region is decreased.

The objects, advantages and novel features of the present invention will be apparent from the following detailed description when read in conjunction with the appended claims and attached drawing.

DESCRIPTION OF THE PREFERRED EMBODIMENT

Figure 1:
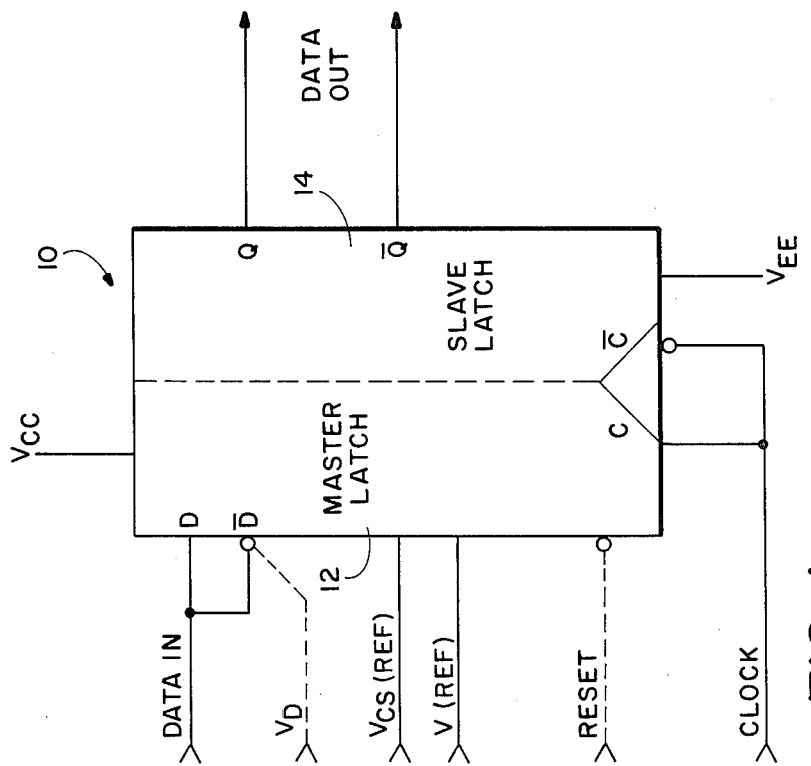
FIG. 1 is a block representation of a D-type master-slave flip-flop.

Referring now to FIG. 1 a typical representation for a D-type flip-flop 10 is shown. The data is input at the D input on the master side 12, whereas in the single-sided circuit of the prior art the /D input was tied to a fixed voltage Vd as indicated by the dotted line from /D. Various bias and supply voltages are applied to the flip-flop 10, such as collector voltage Vcc, emitter voltage Vee base reference voltage V, and current source reference voltage Vcs. A differential clock is input to the clock inputs C and /C with the rising edge of C latching the data into the master side 12 and the rising edge of /C (falling edge of C) latching the data into the slave side 14 at the Q and /Q outputs. In the circuits of the prior art a reset, indicated by a dotted line, has been provided at the master side.

Figure 2:
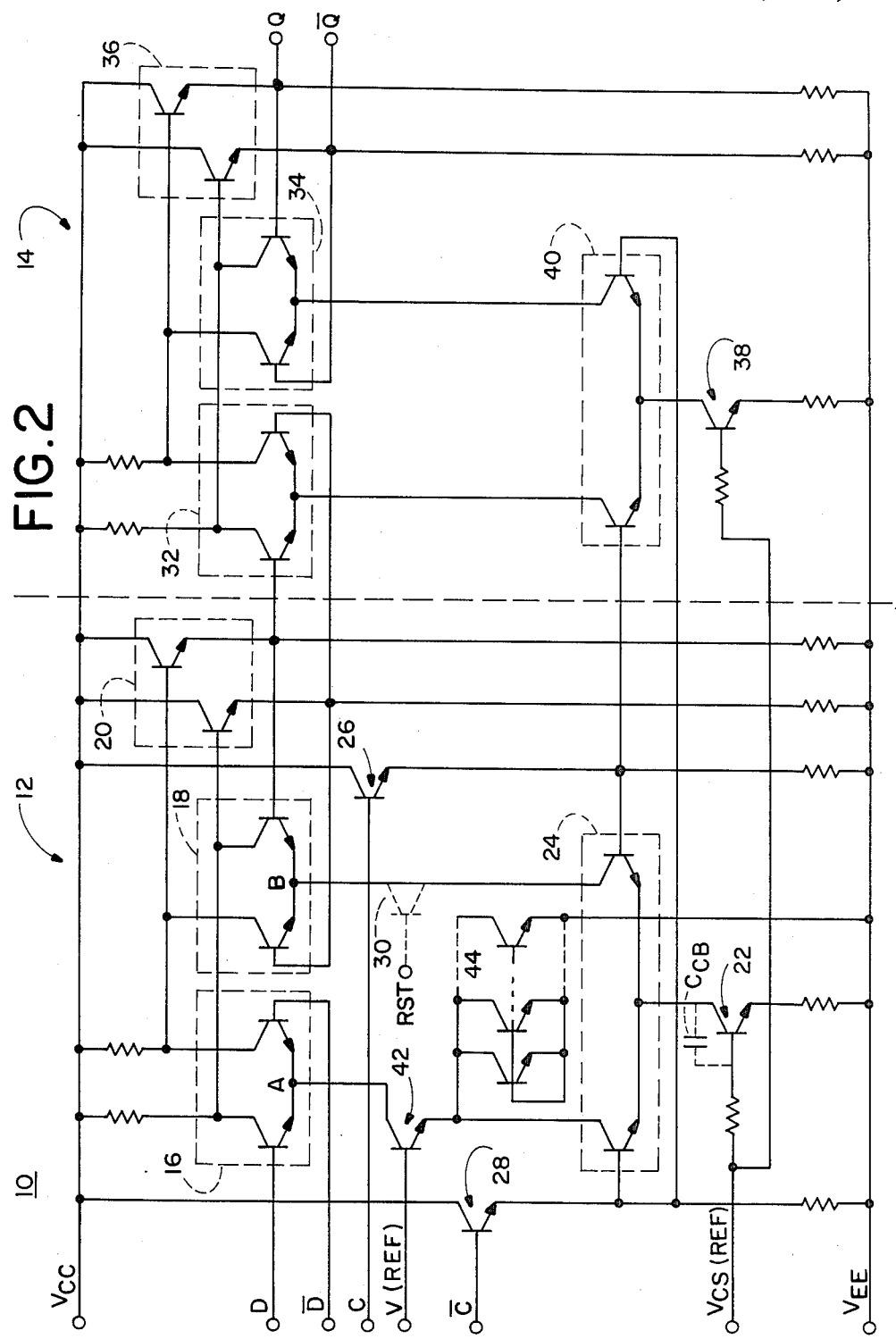
FIG. 2 is a schematic view of a fast latching flip-flop corresponding to FIG. 1 according to the present invention.

As indicated in FIG. 2 the circuitry within the flip-flop 10 is entirely differential, i.e., the /D input is a data input instead of being tied to a fixed voltage Vd as in the prior art and the reset of the prior art has been deleted. The flip-flop 10 has an input amplifier 16 which receives the data input D and /D. The output of the input amplifier 16 is transferred to a master latch 18 via master amplifiers 20. A master current source 22 provides current for both the input amplifier 16 and the master latch 18. A master control switch 24 between the master current source 22 and the input amplifier 16 and master latch 18 combination determines whether the amplifier or the latch conducts current. The master control switch 24 is switched by the differential clock C and /C via respective buffer amplifiers 26 and 28. As indicated by dotted lines a reset amplifier 30 was inserted between the master control switch 24 and the master latch 18 in circuits of the prior art.

On the slave side 14 the contents of the master latch 18 are received by an output amplifier 32 and are transferred to a slave latch 34 via slave amplifiers 36. A slave current source 38 provides the current for the output amplifier 32 and the slave latch 34 combination via a slave control switch 40 which is switched by the differential clock C and /C via the buffer amplifiers 26, 28.

Figure 3:
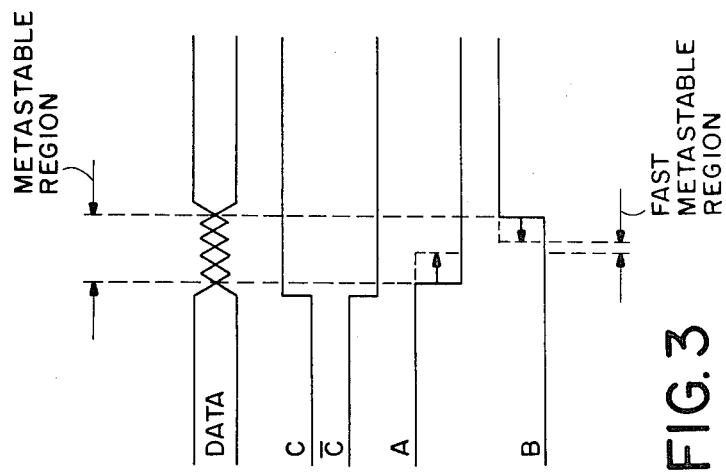
FIG. 3 is a timing diagram showing the metastable region for the fast latching flip-flop.

Referring to FIG. 3 when the differential clock C, /C transitions, the falling edge of /C turns off the current through the input amplifier 16, as indicated at node A, and enables the master latch 18. Due to the charging of parasitic and junction capacitances on the master switch 24 transistors and the current source 22 transistor, particularly the collector/base capacitance Ccb, there is a time when current is applied to neither node A nor B. It is this period of time which defines the period during which operation of the flip-flop 10 is unreliable, i.e., the metastable region. To decrease this metastable region it is necessary to either speed up the turn-on of the master latch 18 or slow down the turn-off of the input amplifier 16, or a combination of both.

The first step in decreasing the metastable region is to remove the reset amplifier 30 from the master latch 18 circuit since the reset amplifier serves to introduce a delay into the turn-on of the master latch 18. By the same token inserting a delay transistor 42 between the input amplifier 16 and the master control switch 24 serves to introduce a delay into the turn-off of the input amplifier. Additional delay is added by connecting a plurality of diode-connected transistors 44 to the junction of the delay transistor 42 and the master control switch 24, effectively adding additional parasitic collector-base capacitance to delay the turn-off of the input amplifier 16. The result is indicated in FIG. 3 where the arrows indicate how the turn-off and turn-on times at nodes A and B are shifted, resulting in a fast metastable region considerably smaller than that attainable using a conventional flip-flop.

Thus the present invention provides a fast latching flip-flop which reduces the metastable region by adding delay into the turn-off of the input amplifier through use of a delay transistor and a plurality of diode-connected transistors which add parasitic capacitance.

What is claimed is:

1. A fast latching flip-flop comprising:
   a master transparent latch section having a differential input amplifier to receive input data, a differential master latch connected to the output of the differential input amplifier via master amplifiers, a master current source to supply current to the differential input amplifier and the differential master latch, and a master switch between the master current source and the differential input amplifier and master latch combination to switch the current from the master current source between the differential input amplifier and the master latch in response to a differential clock signal;
   a slave section having a differential output amplifier to receive the output from the master latch, a differential slave amplifiers connected to the output of the differential output amplifier via slave amplifiers, a slave current source to supply current to the differential output amplifier and the differential slave latch, and a slave switch between the slave current source and the differential output amplifier and slave latch combination to switch the current from the slave current source between the differential output amplifier and the slave latch in response to the differential clock signal; and
   means for delaying turn-off of the differential input amplifier in response to the switching of the current by the master switch from the differential input amplifier to the differential master latch disposed between the master switch and the differential input amplifier so that the turn-off of the current from the master current source to the differential input amplifier is delayed relative to the turn-on of the current from the master current source to the differential master latch thereby decreasing the time between such turn-off and turn on.

2. A fast latching flip-flop as recited in claim 1 wherein the delaying means comprises a delay transistor inserted between the master switch and the differential input amplifier.

3. A fast latching flip-flop as recited in claim 2 wherein the delaying means further comprises means for adding additional capacitance to the delay transistor to provide additional delay in the turn-off of the differential input amplifier.

4. A fast latching flip-flop as recited in claim 3 wherein the adding means comprises a plurality of diode-connected transistors connected at the junction of the delay transistor and the master switch.

5. An improved fast latching flip-flop having a master section with an input amplifier, an output latch connected to the output of the input amplifier, a current source connected to provide current for the input amplifier and the output latch, and means for switching the current from the current source between the input amplifier and the output latch, and having a slave section connected to the output of the master section, wherein the improvement comprises means for delaying the turn-off of the current from the current source to the input amplifier with respect to the turn-on of the current from the current source to the output latch so that the time between such turn-off and turn-on is decreased.

6. An improved fast latching flip-flop as recited in claim 5 wherein the delaying means comprises a delay transistor connected between the switching mean and the input amplifier.

7. An improved fast latching flip-flop as recited in claim 6 wherein the delaying means further comprises a plurality of diode-connected transistors connected at the junction between the switching means and the delay transistor to add parasitic capacitance to the delay transistor to further increase the turn-off delay of the current to the input amplifier.

* * * * *